United States Patent [19]
Ishibashi

[11] Patent Number: 5,374,901
[45] Date of Patent: Dec. 20, 1994

[54] APPARATUS INCLUDING A PLURALITY OF PHASE-LOCKED LOOP CIRCUIT ELEMENTS FOR FORMING A PHASE-LOCKED LOOP CIRCUIT AND METHOD OF FORMING THEREOF

[75] Inventor: Atsuhiko Ishibashi, Itami, Japan

[73] Assignee: Mitsubishi Denki Kabushiki Kaisha, Tokyo, Japan

[21] Appl. No.: 52,095

[22] Filed: Apr. 21, 1993

[30] Foreign Application Priority Data

Apr. 22, 1992 [JP] Japan .................... 4-102784

[51] Int. Cl.$^5$ ............... H03L 7/06; H03L 7/099; H03L 7/085
[52] U.S. Cl. .................... 331/1 A; 331/8; 331/17; 331/34; 331/57; 331/108 C; 257/773; 257/786
[58] Field of Search .................... 331/1 A, 8, 17, 34, 331/57, 74, 108 C, 179; 257/919, 920, 773, 786

[56] References Cited

U.S. PATENT DOCUMENTS 3,484,932 12/1969 Cook .................... 257/786 X
4,079,338 3/1978 Kronlage .................... 331/108 C X

OTHER PUBLICATIONS

"Design of PLL-Based Clock Generation Circuits", by Deog-Kyoon Jeong, et al., IEEE Journal of Solid-State Circuits, vol. SC-22 No. 2, Apr. 1, 1987, pp. 255–261.

Primary Examiner—David Mis
Attorney, Agent, or Firm—Thomas R. Morrison

[57] ABSTRACT

A phase-locked loop circuit includes a voltage controlled oscillator. A phase comparator compares the phase of the output signal of the voltage control led oscillator with a reference signal. A loop filter to which the output signal of the comparator is applied provides a control signal to the voltage controlled oscillator. The voltage controlled oscillator is formed by interconnecting a plurality of oscillator components according to a desired wiring pattern. Each wiring pattern determines the basic oscillation frequency of the voltage controlled oscillator. A loop filter is formed by interconnecting a plurality of loop filter components according to another wiring pattern. Each wiring pattern determining the time constant of the loop filter. The oscillator components, the wiring pattern interconnectors, the comparator, the loop filter components and its wiring pattern interconnectors are disposed on a single substrate. In another embodiment, a decoder is formed from decoder components, which are interconnected by another selected wiring pattern.

14 Claims, 7 Drawing Sheets

APPARATUS INCLUDING A PLURALITY OF PHASE-LOCKED LOOP CIRCUIT ELEMENTS FOR FORMING A PHASE-LOCKED LOOP CIRCUIT AND METHOD OF FORMING THEREOF

This invention relates to a phase-locked loop circuit for synchronizing the phase of a signal produced from a signal generated by a voltage controlled oscillator with the phase of a reference signal.

BACKGROUND OF THE INVENTION

With recent progress in semiconductor technology, operating speeds of devices formed in a semiconductor integrated circuit have been significantly increased. One technical problem to be solved to increase the operating speeds is how to distribute at a high speed to such various devices in a semiconductor integrated circuit, a clock signal which defines the operating speeds of the devices.

One proposal is to synchronize the phase of a clock signal to be applied to the various devices in the semiconductor integrated circuit with the phase of an externally applied clock signal by means of a phase-locked loop circuit formed in the semiconductor integrated circuit, to thereby avoid delay which could be imparted when the clock is applied to the respective devices.

On example of an analog-type phase-locked loop circuit used for such a purpose is shown in FIG. 1. This circuit is substantially the same as the one disclosed in IEEE JOURNAL OF SOLID-STATE CIRCUITS, Vol. 22, No., Apr. 2, 1987, pages 255-261.

In this circuit, a clock signal generated by a voltage controlled oscillator 10 is decoded into four-phase oscillation output signals $\phi 1$, $\phi 2$, $\phi 3$ and $\phi 4$, by means of a decoder and buffer 12.

The signal $\phi 1$ is applied to a phase comparator 14 for phase comparison with a reference clock signal REF, and the comparator 14 provides an UP signal or a DOWN signal to a charge-pump circuit 16 in accordance with the phase difference.

The charge-pump circuit 16, upon receiving the UP or DOWN signal from the comparator 14, provides positive or negative charge as a pulse signal to a loop filter circuit 18.

The function of the loop filter circuit 18 is to smooth the pulse signal from the charge-pump circuit 16. The loop filter circuit 18 includes resistors 20 and 22 connected in series with the junction between them providing an output node of the circuit 18. The output signal from the charge-pump circuit 16 is applied to the end of the resistor 20 remote from the junction. A capacitor 24 is connected between the end of the resistor 22 remote from the junction and a point of ground potential. The smoothed output signal from the loop filter circuit 18 is applied to the voltage controlled oscillator 10 as a control signal therefor.

Assume, for example, that the phase of the oscillator output signal $\phi 1$ lags relative to the phase of the reference clock signal REF. The phase comparator 14 provides, as the UP signal, a pulse signal having a width corresponding to the phase difference between the oscillator output signal $\phi 1$ and the reference clock signal REF, and places the DOWN signal to a low level. This causes the charge-pump circuit 16 to supply positive charge in an amount corresponding to the phase difference to the loop filter circuit 18. The loop filter circuit 18 integrates the thus supplied positive charge so as to gradually increase its output voltage. As a result, the oscillation frequency of the voltage controlled oscillator 10 slightly rises to reduce the phase difference of the oscillator output signal $\phi 1$ from the reference clock signal REF. This operation is repeated until the oscillator output signal $\phi 1$ coincides in phase with the reference clock signal REF.

In case that the oscillator output signal $\phi 1$ leads in phase the reference clock signal REF, the phase comparator 14 provides a pulse signal having a width corresponding to the phase difference as the DOWN signal, and places the UP signal to the low level. Then, the charge-pump circuit 16 supplies negative charge corresponding to the phase difference represented by the DOWN signal to the loop filter circuit 18, which integrates the thus supplied negative charge and lowers its output voltage. This causes the oscillation frequency of the voltage controlled oscillator 10 to slightly decrease, which, in turn, reduces the phase difference of the oscillator output signal $\phi 1$ from the reference clock signal REF. Such operation is repeated until the oscillator output signal $\phi 1$ coincides in phase with the reference clock signal REF.

According to the disclosure in this publication, in order for the phase-locked loop circuit to operate to make the phases of the reference clock signal REF and the oscillator output signal $\phi 1$ coincide with each other, the phase-locked loop circuit must operate in a such a state that $\omega_i \tau_2$ and $K\tau_2$ are located in a stable region which is on the right side of stability limit lines 26 and 28 shown in FIG. 2. In FIG. 2, $\omega_i$ on the abscissa represents an angular frequency ($=2f\pi$, where f is the frequency of the reference clock signal REF) of the reference clock signal REF, $\tau_2$ represents the time constant provided by the resistor 22 and the capacitor 24, K on the ordinate is equal to $K_O I_P R2$ where $K_O$ is the gain of the voltage controlled oscillator 10 (i.e. a value showing the change of the oscillation frequency of the voltage controlled oscillator 10 for a change in the output voltage of the loop filter circuit 18), $I_P$ is the maximum current flowing through the resistor 20 (which decreases as the resistor 20 has a larger value), and R2 is the value of the resistor 22. The stability limit line 26 is for a theoretical delay time td of $0.1\tau_2$, and the line 28 is for a theoretical delay time td which is equal to 0.

As will be understood from FIG. 2, if the frequency of the reference clock signal REF must be changed largely, the gain of the voltage controlled oscillator 10, and the values of the resistors 20 and 22 and the capacitor 24 which constitutes the loop filter circuit 18 must be designed anew so that the $\omega_i \tau_2$ and $K \tau_2$ can be located in the stable region on the right side of the stability limit lines 26 and 28.

Conventional phase-locked loop circuits have been designed on the basis of the frequency of the reference clock signal REF determined according to customers' request, and the voltage controlled oscillator 10, the loop filter circuit 18 etc. are designed for the thus determined reference clock signal frequency. Thereafter, mask patterns are prepared based on the thus designed circuit configuration for manufacturing the particular phase-locked loop circuits desired by customers. That is, conventional phase-locked loop circuits are custom-designed devices.

There is a desire to provide semi-custom semiconductor integrated circuits, such as gate arrays, which include a phase-locked loop circuit therein for synchronizing a signal with an externally supplied clock signal and supplying the thus synchronized signal to various devices formed by the gate array. However, the frequency of the externally supplied clock signal varies depending on customers' orders. Therefore, in order to produce a gate array including a phase-locked loop circuit, such gate array must be made only after designing the voltage controlled oscillator 10, the loop filter circuit 18 etc. forming the phase-locked loop circuit for a particular frequency desired by a particular customer. This disadvantageously lessens the advantage of the gate array of being a general-purpose device.

SUMMARY OF THE INVENTION

According to the present invention, apparatus for forming a phase-locked loop circuit includes means for forming voltage controlled oscillator means which generates a variable oscillation frequency in accordance with a control voltage. The voltage controlled oscillator means forming means comprises a plurality of oscillator forming elements. The oscillator forming elements are connected in accordance with a first wiring pattern to form the voltage controlled oscillator means. The first wiring pattern represents one of many possible configurations selectable by a customer. Each first wiring pattern designates the reference clock signal by the customer. Comparator means is provided to compare the phase of the output signal of the voltage controlled oscillator means formed by said forming means with the phase of a reference signal. The apparatus further includes means for forming loop filter means which permits a low frequency component of the output signal of the comparator means to pass therethrough to thereby couple the low frequency component to the voltage controlled oscillator means as the control voltage for the voltage controlled oscillator means. The loop filter means forming means comprises a plurality of time constant providing elements which are connected in accordance with second wiring pattern. Similarly, the time constant of the loop filter can be set as desired by the customer by selecting a second wiring pattern.

The voltage controlled oscillator means forming means, the comparator means, and the loop filter means forming means may be formed on a single substrate on which a gate array can be formed.

Means for forming decoder means may be disposed for decoding the output signal of the voltage controlled oscillator means. The decoder means forming means includes a plurality of decoder forming elements which are connected together in accordance with a third wiring pattern. The third wiring pattern is selectable, just as the wiring patterns above.

DETAILED DESCRIPTION OF EMBODIMENTS

Figure 3:
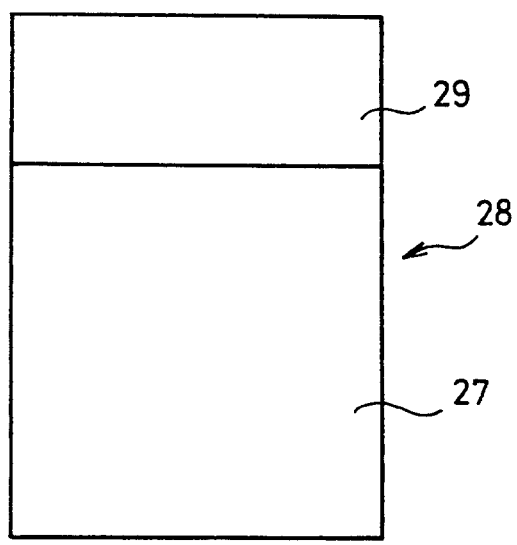
FIG. 3 is a plan view of a substrate on which apparatus for forming a phase-locked loop circuit of the present invention is to be disposed.

A phase-locked loop circuit according to an embodiment of the present invention includes a phase comparator, a charge-pump circuit, a loop filter circuit, a voltage controlled oscillator, and a decoder. The phase-locked loop circuit is disposed, for example, in a predetermined region 29 of a substrate 28 shown in FIG. 3, on which a gate array 27 is also disposed. The phase-locked loop circuit is shielded from the gate array.

It is arranged such that the loop filter circuit, the voltage controlled oscillator and the decoder can be variably configured in accordance with requirements by a customer. On the other hand, the phase comparator and the charge-pump circuit may remain same even when the configurations of the loop filter circuit, the voltage controlled oscillator and/or decoder are modified. Accordingly, both in FIGS. 4 and 7, the same reference numerals 25 and 26 are attached to them, respectively. The phase comparator and the charge-pump circuit shown in the above-cited publication, namely, IEEE JOURNAL OF SOLID-STATE CIRCUITS, Vol. 22, No., April 2, 1987, may be used.

Figure 5:
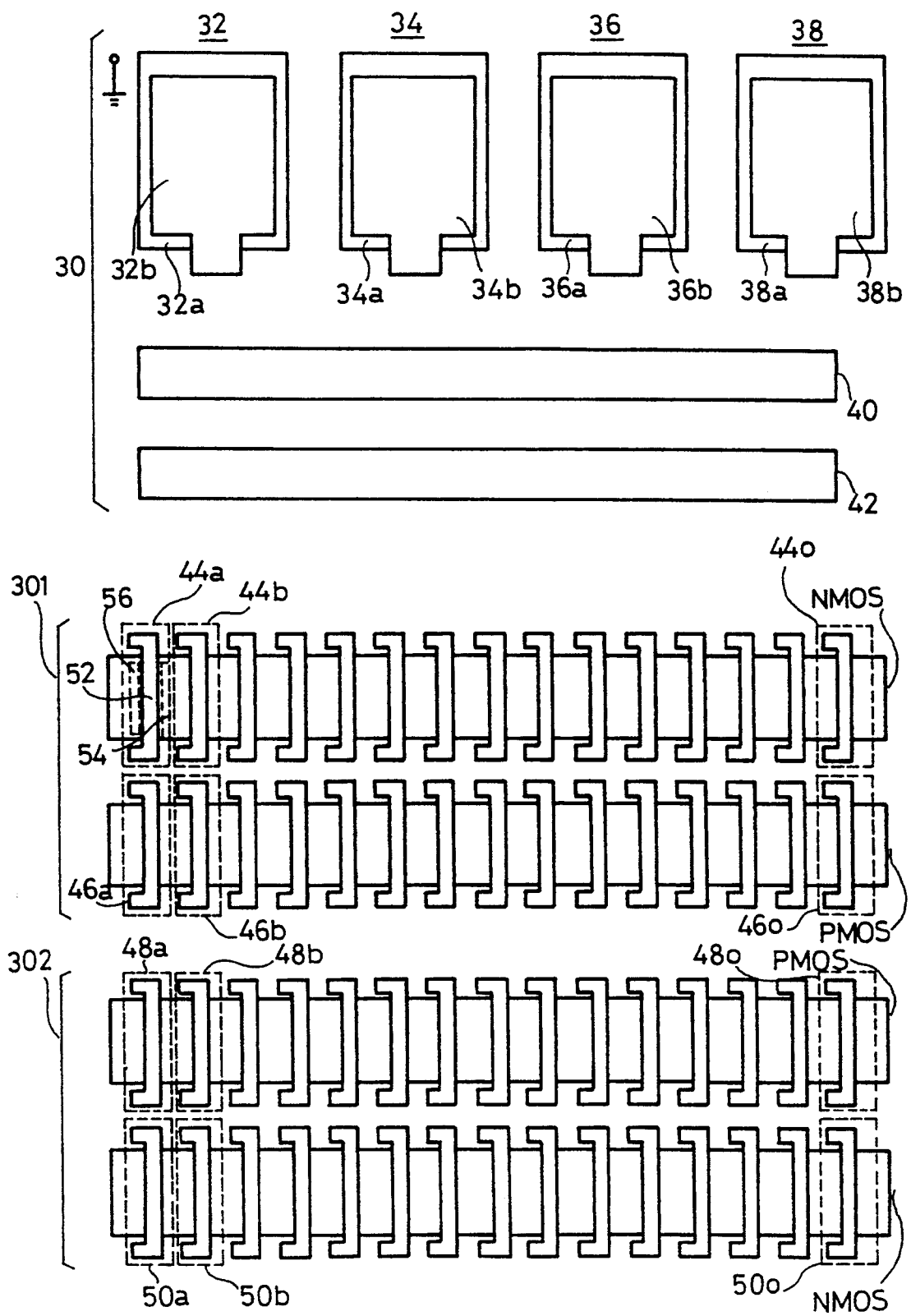
FIG. 5 is a plan view of a portion of the apparatus for forming a phase-locked loop circuit according to the present invention.

In order for the loop filter circuit, the voltage controlled oscillator, and the decoder to be modifiable in configuration, the region 29 contains, in addition to a phase comparator 25 and a charge-pump circuit 26, a loop filter circuit forming assembly 30, a voltage controlled oscillator forming assembly 301, and a decoder circuit forming assembly 302, as shown in FIG. 5. Each of the forming assemblies can be connected to meet the requirements of the customer. Each different configuration would represent a different basic oscillating frequency corresponding to the customer's choice of the reference clock signal.

The loop filter circuit forming assembly includes capacitor units 32, 34, 36 and 38, and resistors 40 and 42. The capacitor units 32, 34, 36 and 38 have lower electrodes 32a, 34a, 36a and 38a, respectively, and also corresponding upper electrodes 32b, 34b, 36b and 38b, respectively, which face to the associated lower electrodes, respectively. Although not shown, a dielectric material is disposed between the respective facing electrodes 32a and 32b, 34a and 34b, 36a and 36b, and 38a and 38b, so that a predetermined capacitance is exhibited by each capacitor unit.

The resistors 40 and 42 are formed of strips each having a predetermined resistance value.

A loop filter circuit is formed by selectively connecting the capacitor units 32, 34, 36 and 38 and the resistors 40 and 42. More particularly, depending on which capacitor units are to be interconnected and depending on how they are connected, the overall capacitance of the loop filter capacitor varies. Depending on what portions of the strip resistors 40 and 42 are to be connected to the capacitor and to a part of the voltage controlled oscillator forming assembly 301, and depending on what part of the voltage controlled oscillator forming assembly 301 the portions of the strip resistors 40 and 42 are connected to, the resistances of the resistors forming the loop filter are determined. Thus, a loop filter circuit having a time constant required for operation at a reference clock frequency desired by a customer.

The voltage controlled oscillator forming assembly 301 comprises, for example, fifteen N-channel MOSFET's (hereinafter referred to as NMOSFET's) 44a–44o, and also, for example, fifteen P-channel MOSFET's (hereinafter referred to as PMOSFET's) 46a–46o. In accordance with a customer's request, selectively combining a set of these NMOSFET's, inverters, current sources for the inverters, capacitance for the inverters, etc. are formed to provide a voltage controlled oscillator of which the oscillation frequency can be varied in accordance with a control voltage supplied by the loop filter circuit.

A voltage controlled oscillator operating at a reference clock frequency as desired by a customer can be fabricated by selecting, for example, an appropriate number of stages for forming each inverter and an appropriate value for the load capacitance of each inverter.

The decoder circuit forming assembly 302 comprises, for example, fifteen P-channel MOSFET's (hereinafter referred to as PMOSFET's) 48a–48o, and fifteen NMOSFET's 50a–50o. By Each of these elements may be combined in any manner to meet the customer's preference of reference clock signal. combining appropriate ones of the PMOSFET's and the NMOSFET's, logic circuits, such as inverters, NAND circuits, NOR circuits and the likes are formed. Using these logic circuits, a circuit for decoding the oscillation signal supplied from the voltage controlled oscillator is formed. By appropriately selecting logic circuits to be used and also by appropriately connecting them, a decoder circuit which can produce decoder outputs as desired by the customer can be formed.

As represented by the NMOSFET 44a, each of the NMOSFET's 44a–44o, and 50a–50o, and the PMOSFET's 46a–46o and 48a–48o, has a gate region 52 and source and drain regions 54 and 56 on opposite sides of the gate region 52.

As described above, excluding the phase comparator 25 and the charge-pump circuit 26, the loop filter circuit, the voltage controlled oscillator and the decoder circuit can be freely modified to meet the configuration as desired by the customer. In accordance with a frequency of a reference clock signal notified by a customer, a loop filter circuit 60, a voltage controlled oscillator 62, and a decoder circuit 64 as shown in FIG. 4, for example, are produced.

Figure 1:
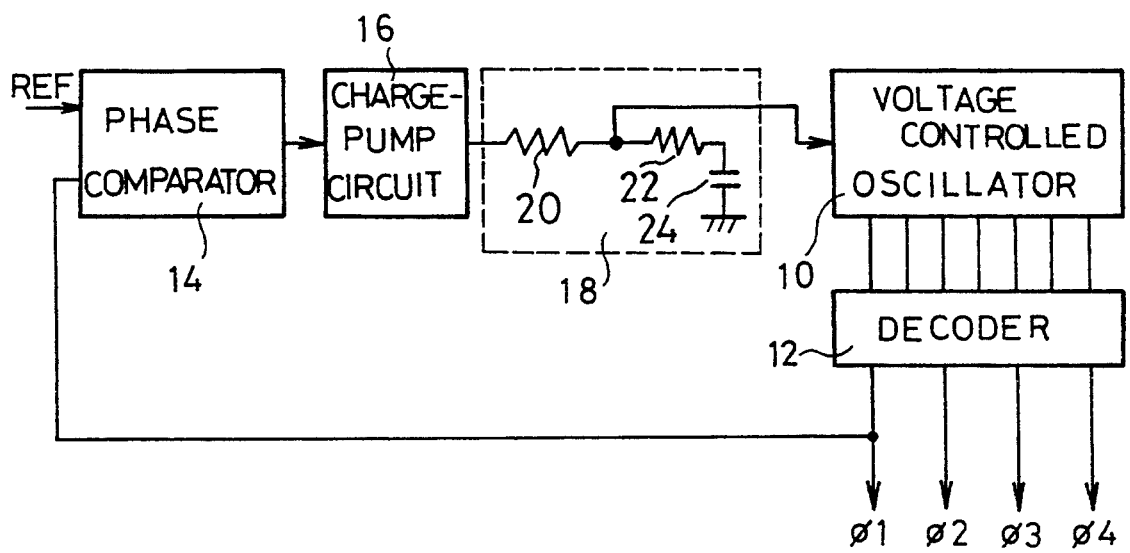
FIG. 1 is a block diagram of a conventional phase-locked loop circuit.
Figure 2:
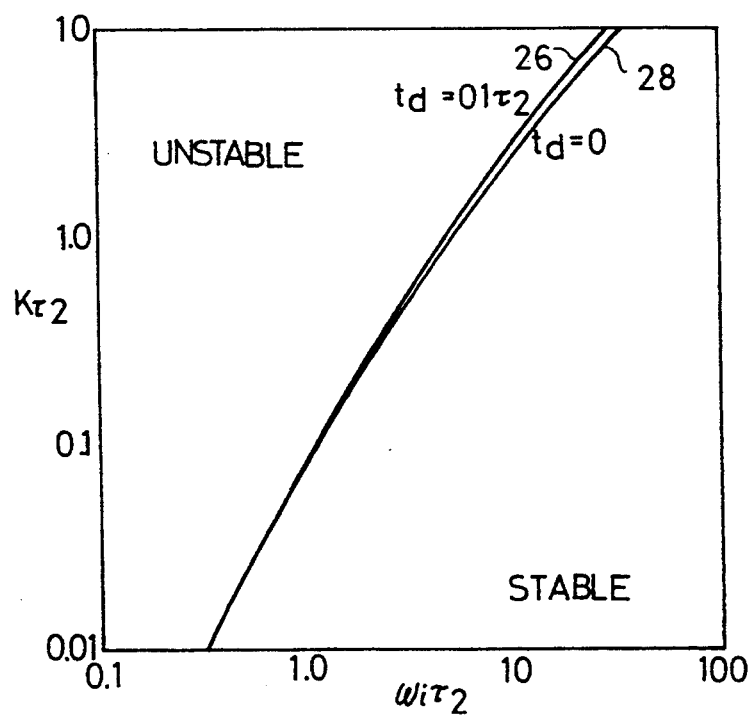
FIG. 2 shows stability and unstability limits of the phase-locked loop circuit of FIG. 1.
Figure 4:
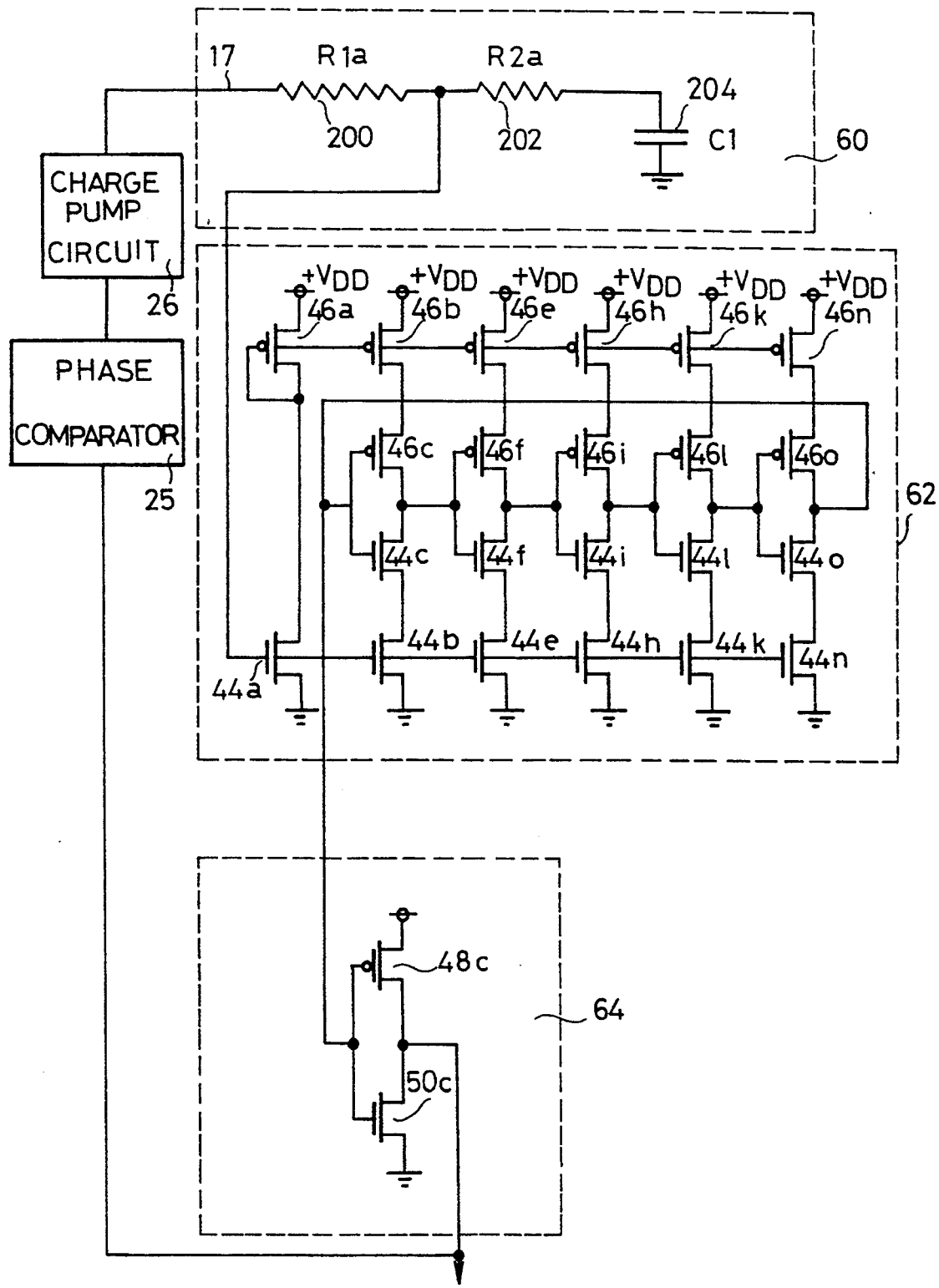
FIG. 4 is a circuit diagram of an example of a phase-locked loop circuit formed from the apparatus according to the present invention.

Similar to the loop filter circuit 18 shown in FIG. 1, the loop filter circuit 60 shown in FIG. 4 includes resistors 200 and 202, and a capacitor 204, and the resistors 200 and 202 and the capacitor 204 have been designed to have resistance values of R1 and R2, respectively, and a capacitance value of C1.

The voltage controlled oscillator 62 is designed to have five serially connected inverters forming a loop. Each of the inverters comprises a PMOSFET and an NMOSFET. The PMOSFET's 46c, 46f, 46i, 46l, and 46o, and the NMOSFET's 44c, 44f, 44i, 44l, and 44o are used for forming the inverters. According to this design, current sources provided by the PMOSFET's 46b, 46e, 46h, 46k, and 46n are connected to the sources of the respective PMOSFET's 46c, 46f, 46i, 46l, and 46o. The respective current sources are connected to a voltage source of +VDD. Similarly, current sources provided by the NMOSFET's 44b, 44e, 44h, 44k, and 44n are connected to the sources of the NMOSFET's 44c, 44f, 44i, 44l, and 44o, respectively. These current sources are connected to a point of ground potential VSS.

These current sources are controlled by a mirror circuit formed by the PMOSFET 46a and the NMOSFET 44a. The mirror circuit receives a control voltage from the loop filter circuit 60. In response to the control voltage, the amounts of currents to be supplied to the respective inverters are controlled by the PMOSFET current sources and the NMOSFET current sources, respectively, whereby the amount of delay time in each of the inverters is controlled, which, in turn, varies the oscillation frequency.

The decoder circuit 64 receives as its input the input voltage which is applied to the inverter formed by the PMOSFET 46c and the NMOSFET 44c. The decoder circuit 64 comprises the PMOSFET 48c and the NMOSFET 50c.

Figure 6:
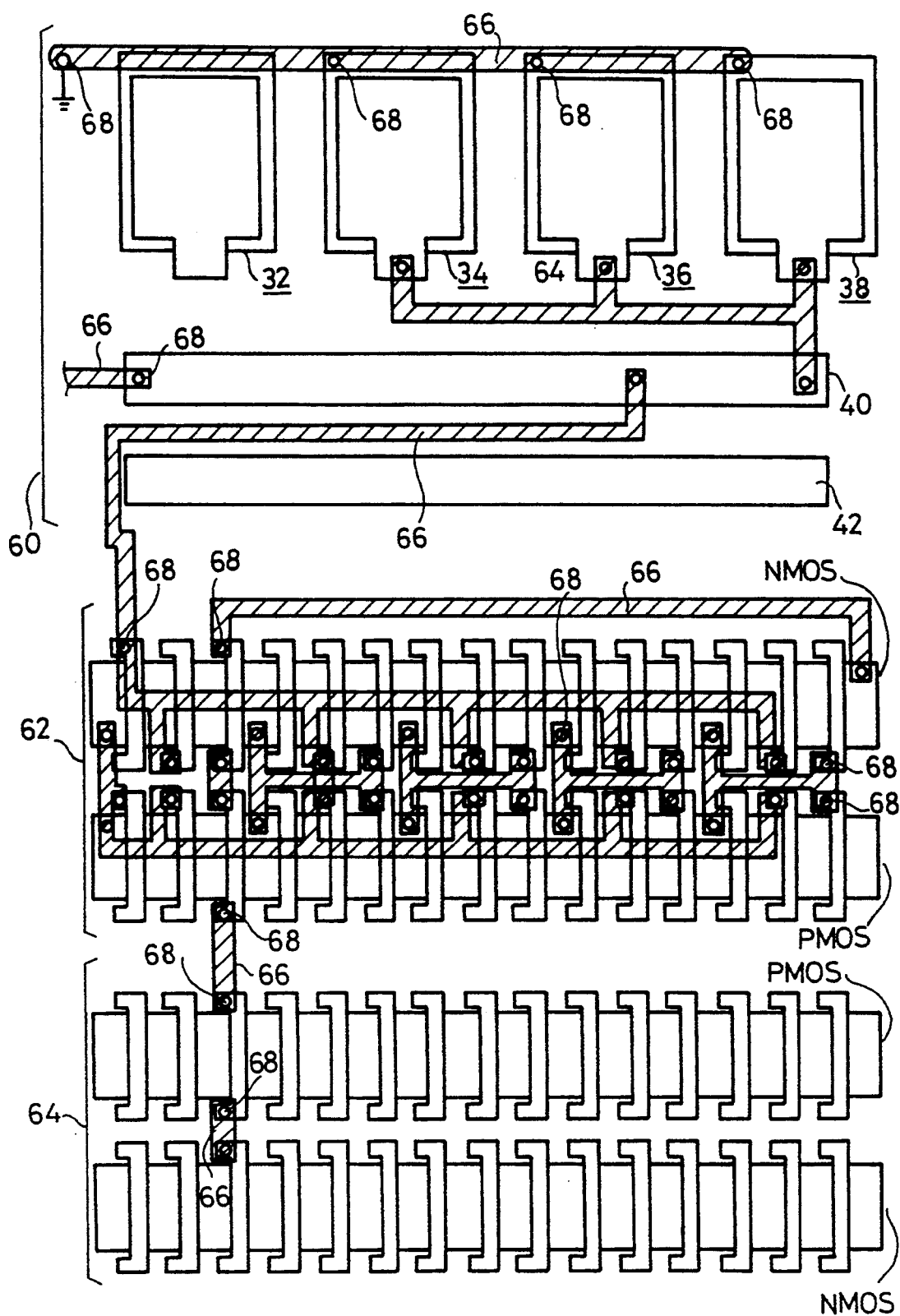
FIG. 6 is a plan view of a portion of the circuit of FIG. 4.

After designing the loop filter circuit 60, the voltage controlled oscillator 62 and the decoder circuit 64 as described above, a mask for forming a metallic wiring pattern is fabricated for use in producing the circuits 60, 62 and 64 as designed, from the loop filter circuit forming assembly 30, the voltage controlled oscillator forming assembly 301, and the decoder circuit assembly 302 shown in FIG. 5. The mask is used to form a metallic wiring pattern 66 (FIG. 6) over the loop filter circuit assembly 30, the voltage controlled oscillator forming assembly 301 and the decoder circuit forming assembly 302. FIG. 6 shows the metallic wiring pattern 66 formed on the respective assembly 30, 301 and 302 to thereby form the loop filter 60, the voltage controlled oscillator 62 and the decoder circuit 64 of FIG. 4. It should noted, however, that for simplicity of illustration, only a part of the wiring 66 is illustrated for the voltage controlled oscillator 66 and the decoder circuit 64. The metallic wiring 66 shown in FIG. 6 comprises a single layer. In FIG. 6, a reference numeral 68 indicates contact points at which the metallic wiring 66 is connected to associated constituent components.

Figure 7:
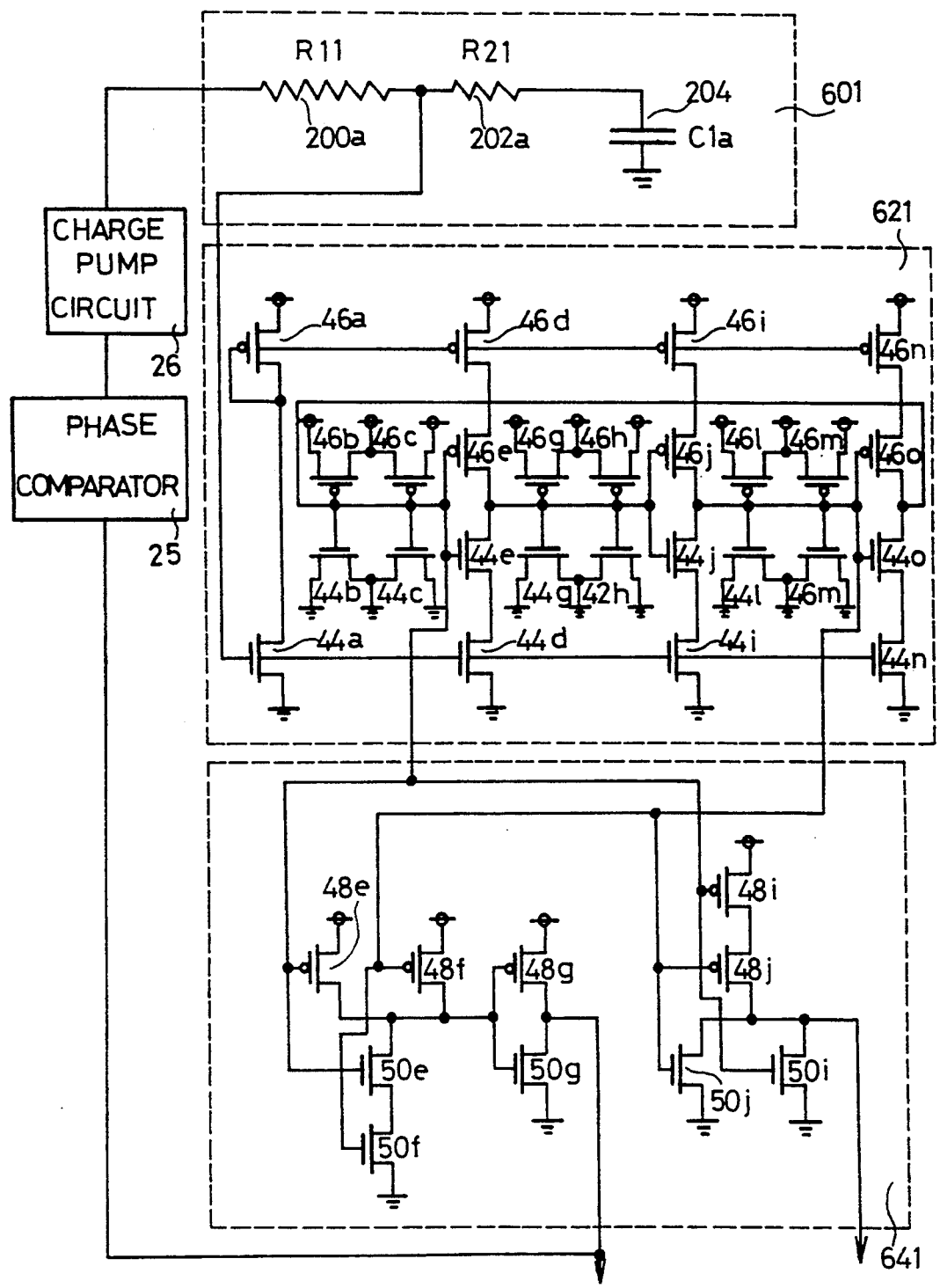
FIG. 7 shows another example of a phase-locked loop circuit formed from the apparatus of the present invention.

A phase-locked loop circuit may be designed as shown in FIG. 7 in compliance with an order of another customer who uses a different reference clock signal frequency. A loop filter circuit 601 of the phase-locked loop circuit of FIG. 7 is similar to the loop filter circuit 60 of FIG. 4 and comprises resistors 200a and 202a and a capacitor 204a. The resistors 200a and 202a have resistance values of R11 and R21, respectively, and the capacitance 204a has a capacitance value of C1a.

A voltage controlled oscillator 621 includes three inverters connected in series to form a loop. Each of the inverters comprises a PMOSFET and an NMOSFET. The PMOSFET 46e and the PMOSFET 44e form a first inverter, the PMOSFET 46j and the NMOSFET 44j form a second inverter, and the PMOSFET 46o and the NMOSFET 44o form a third inverter. On the source sides of the respective PMOSFET's 46e, 46j and 46o, current sources formed respectively by the PMOSFET's 46d, 46i and 46n are connected, and similarly, current sources formed by the NMOSFET's 44d, 44i and 44n are connected to the respective inverters on their source sides.

The current sources are controlled by a current mirror circuit which comprises the PMOSFET 46a and the NMOSFET 44a. The current mirror circuit controls the amounts of current from the respective current sources in response to the control voltage supplied from the loop filter circuit 601.

On the input side of each inverter, a capacitance is provided for adjusting the basic delay amount in that inverter. Each of the capacitances is provided by two PMOSFET's having their drain and source regions connected to the voltage source of +VDD and having their gates connected to the inverter, and two NMOSFET's having their drain and source regions grounded and having their gates connected to the input of the inverter. The PMOSFET's 46b, 46c, 46g, 46h, 46l and 46m, and the NMOSFET's 44b, 44c, 44g, 44h, 44l and 44m are used to form these capacitances.

A decoder circuit 641 receives an input voltage to the inverter comprising the PMOSFET 46e and the NMOSFET 44e and also an input voltage to the inverter comprising the PMOSFET 46o and the NMOSFET 44o, and develops two-phased clock signals. The decoder circuit 641 comprises an NAND circuit to which the two input voltages are applied and an inverter for inverting the output of the NAND circuit to thereby develop a clock signal to be supplied to a phase comparator circuit 25. Specifically, the NAND circuit comprises the PMOSFET's 48e and 48f and the NMOSFET's 50e and 50f, and the inverter comprises the PMOSFET 48g and the NMOSFET 50g.

The decoder circuit 641 is designed to provide another clock signal from a NOR circuit which receives the same two input voltages as applied to the NAND circuit. Specifically, the NOR circuit is formed by the PMOSFET's 48i and 48j and the NMOSFET's 50j and 50i.

After designing the loop filter circuit 601, the voltage controlled oscillator 621, and the decoder circuit 641 as described above, a mask for forming a metallic wiring pattern 661 (FIG. 8) for fabricating the circuits 601, 621 and 641 as designed, from the assemblies 30, 301 and 302 shown in FIG. 5, is prepared. This mask is used to dispose the wiring pattern 661 on the loop filter circuit forming assembly 30, the voltage controlled oscillator forming assembly 301, and the decoder circuit forming assembly 302, which completes the loop filter circuit 601, the voltage controlled oscillator 621 and the decoder circuit 641.

Figure 8:
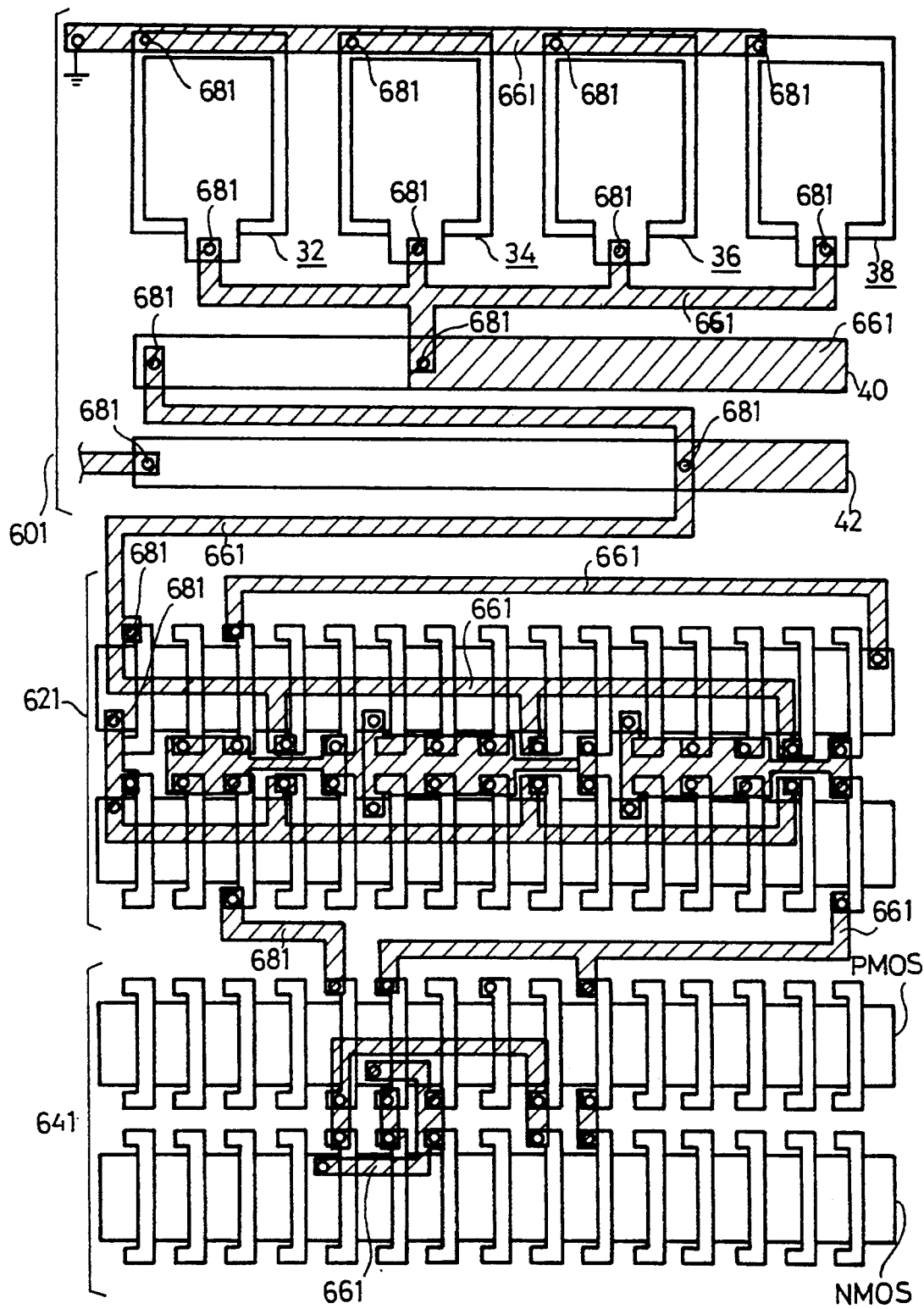
FIG. 8 is a plan view of a portion of the circuit of FIG. 7.

FIG. 8 shows the metallic wiring pattern 661 disposed on the respective assemblies 30, 301 and 302 of FIG. 5 to thereby form the loop filter circuit 601, the voltage controlled oscillator 621 and the decoder circuit 641. It should be note, however, for simplicity of illustration, only part of the metallic wiring pattern 661 is shown for the voltage controlled oscillator 621 and the decoder circuit 641, since such wiring is very complicated. The metallic wiring pattern 661 also comprises a single layer. A reference numeral 681 denotes contact points at which the respective wires in the pattern 661 are connected to associated components.

It will be understood from FIGS. 6 and 8 that from the same loop filter forming assembly 30, voltage controlled oscillator forming assembly 301 and the decoder circuit forming assembly 302, different phase-locked loop circuits operating for different reference clock signal frequencies in conformity with the customers' order can be easily fabricated.

In the above-described embodiments, the metallic wiring patterns 66 and 661 are comprised of a single layer, but they may be of a multi-layered structure with respective layers connected through through-holes formed therethrough. Also, in the loop filter circuit forming assembly, two separate resistors 40 and 42 are used, but they may be replaced by a single resistor. Furthermore, the charge-pump circuit and the decoder circuit are used in the described embodiments, they may be unnecessary in some cases.

It should be noted further that although the voltage controlled oscillator has been described to comprise only MOSFET's, it may comprise resistors and capacitors in addition to MOSFET's, or, it may comprise MOSFET's and/or bipolar transistors, resistors and capacitors. In such cases, not only NMOSFET's 44a–44o and PMOSFET's 46a–46o, but also resistors and capacitors and, if necessary, bipolar transistors are formed in the region for the assembly 301 in FIG. 5, and appropriate ones of the components are connected by means of an appropriate wiring pattern according to a clocking scheme employed, to thereby form a desired voltage controlled oscillator.

What is claimed is:

1. A semiconductor device, for forming a phase-locked loop circuit having variable characteristics dependent upon interconnection patterns to be applied, comprising:
   a substrate;
   a plurality of oscillator components disposed in an arrangement in a first area of said substrate facilitating multiple oscillator interconnection patterns for forming a voltage controlled oscillator having a predetermined frequency range;
   combinations of said plurality of oscillator components and multiple oscillator interconnection patterns pertaining selection of said predetermined frequency range from a range of frequency ranges;
   means for comparing a phase of an output signal from said voltage controlled oscillator with a reference clock signal;
   a plurality of loop filter components disposed proximate to each other in a second area of said substrate facilitating multiple filter interconnection patterns for forming a loop filter having a predetermined time constant;
   combinations of said plurality of loop filter components and filter interconnection patterns permitting: selection of said predetermined time constant from a range of time constants;
   said first area being disposed proximate to said second area facilitating connection of an output of said loop filter to an input of said voltage controlled oscillator; and
   said second area being disposed proximate to said means for comparing facilitating connection of an output of said means for comparing to an input of said loop filter.

2. Apparatus as recited in claim 1, wherein said substrate includes a gate array disposed thereon.

3. Apparatus as recited in claim 2, wherein said phase-locked loop circuit provides an internal clock signal to said gate array.

4. Apparatus for forming a phase locked loop circuit comprising:
   a substrate;
   a plurality of oscillator components disposed in an arrangement in a first area of said substrate facilitating multiple oscillator interconnection patterns for forming a voltage controlled oscillator having a predetermined frequency range;
   a plurality of loop filter components disposed proximate to each other in a second area of said substrate facilitating multiple filter interconnection patterns for forming a loop filter having a predetermined time constant;

combinations of said plurality of loop filter components and filter interconnection patterns permitting selection of said predetermined time constant from a range of time constants;

a plurality of decoder components disposed in an arrangement in a decoder area of said substrate facilitating multiple decoder interconnection patterns for constructing a decoder circuit having a predetermined decoder function chosen from a variety of decoder functions implementable by interconnection of said decoder components;

said decoder area being disposed proximate to said first and second areas facilitating connections for generation of a decoded signal from an output of said voltage controlled oscillator;

means for comparing a phase of said decoded signal with a reference clock signal; and said second area containing said loop filter components being disposed proximate to said means for comparing and said first area containing said plurality of oscillator components facilitating applying an output of said means for comparing to said loop filter and an output of said loop filter to said voltage controlled oscillator.

5. Apparatus as recited in claim 4, wherein said substrate includes a gate array disposed thereon.

6. The apparatus according to claim 5, wherein said decoded signal is applicable as an internal clock signal for a circuit formed by said gate array.

7. A method for forming a phase locked loop circuit comprising the steps of:

arranging a plurality of oscillator components on a substrate proximate to each other to facilitate interconnection by interconnection patterns selected to form an oscillator having a frequency range of operation selected from a range of frequency ranges implementable by interconnecting said oscillator components;

arranging a plurality of loop filter components on said substrate to facilitate interconnection by interconnection patterns selected to form a loop filter having a time constant selected from a range of time constants implementable by interconnecting said loop filter components; and providing a means for comparing on said substrate;

arranging said oscillator components, said loop filter components and said means for comparing in distinct areas proximate to each other to facilitate interconnecting an oscillator and a loop filter to be formed with said means for comparing to provide for creation of said phase locked loop circuit.

8. The method for forming a phase locked loop circuit according to claim 7, further comprising the steps of:

arranging a plurality of decoder components on said substrate proximate to each other to facilitate interconnection thereof providing a decoder circuit having a decoder function selected from a plurality of decoder functions implementable by combinations of said decoder components;

locating said decoder components on said substrate adjacent an are containing one of said oscillator components and said loop filter components to provide for incorporating a decoder circuit to be formed within said phase locked loop circuit.

9. The method for forming a phase locked loop circuit according to claim 7, further comprising the steps of arranging a gate array on said substrate.

10. A semiconductor device, for forming a phase-locked loop circuit having variable characteristics dependent upon a wiring pattern to be applied, comprising:

a substrate;

oscillator components disposed in an arrangement in a first area of said substrate facilitating multiple oscillator interconnection patterns for forming a voltage controlled oscillator having a predetermined frequency range, an input and an output;

combinations of said oscillator components and multiple oscillator interconnection patterns permitting selection of said predetermined frequency range from a range of frequency ranges;

comparing means for performing a phase comparison;

said comparing means having a first input accepting an output signal from said voltage controlled oscillator, a second input accepting a reference clock signal and an output;

loop filter components disposed proximate to each other in a second area of said substrate facilitating multiple filter interconnection patterns for forming a loop filter having a predetermined time constant, an input and an output;

combinations of said loop filter components and filter interconnection patterns permitting selection of said predetermined time constant from a range of time constants;

said first area being disposed adjacent to said second area facilitating connection of said input of said voltage controlled oscillator to said output of said loop filter; and said comparing means being disposed proximate to said first and second areas facilitating coupling of said output of said voltage controlled oscillator to said first input of said comparing means and connection of said output of said comparing means to an input of said loop filter.

11. The semiconductor device according to claim 10 wherein:

said loop filter components include capacitor elements and resistor elements;

said capacitor elements are arranged in a group adjacent each other;

said resistor elements are arranged in a group adjacent each other; and said groups of capacitor and resistor elements are adjacent each other.

12. The semiconductor device according to claim 10 wherein said oscillator components includes transistors serially arranged in a linear array.

13. The semiconductor device according to claim 11 further comprising decoder components disposed in an arrangement in a third area of said substrate facilitating multiple decoder interconnection patterns for forming a decoder having a predetermined decoding function, an input and an output;

combinations of said decoder components and multiple decoder interconnection patterns permitting selection of said predetermined decoder function from a group of at least two decoder functions; and said third area being disposed on said substrate proximate to said first area.

14. The semiconductor device according to claim 13 wherein said decoder components includes transistors serially arranged in a linear array.

* * * * *